US011569595B2

(12) United States Patent
Oosaka

(10) Patent No.: US 11,569,595 B2
(45) Date of Patent: Jan. 31, 2023

(54) CONNECTOR ASSEMBLY

(71) Applicant: Japan Aviation Electronics Industry, Ltd., Tokyo (JP)

(72) Inventor: Junji Oosaka, Tokyo (JP)

(73) Assignee: Japan Aviation Electronics Industry, Ltd., Tokyo (JP)

(*) Notice: Subject to any disclaimer, the term of this patent is extended or adjusted under 35 U.S.C. 154(b) by 0 days.

(21) Appl. No.: 17/320,347

(22) Filed: May 14, 2021

(65) Prior Publication Data

US 2022/0045445 A1 Feb. 10, 2022

(30) Foreign Application Priority Data

Aug. 5, 2020 (JP) .............................. JP2020-133128

(51) Int. Cl.
*H01R 12/57* (2011.01)
(52) U.S. Cl.
CPC .................... *H01R 12/57* (2013.01)
(58) Field of Classification Search
CPC ...... H01R 12/57; H01R 12/714; H01R 12/73; H01R 43/205; H01R 12/7029; H01R 12/7011; H01R 12/7017; H01R 13/514; H05K 2201/045; H05K 1/141; H05K 1/142; H05K 3/303; H05K 3/365; H05K 3/3436; H05K 2201/10189; H05K 2203/085; H05K 2203/166; H05K 2203/167
See application file for complete search history.

(56) References Cited

U.S. PATENT DOCUMENTS 5,899,760 A * 5/1999 Ho ...................... H05K 13/0409
439/135
8,526,275 B1 * 9/2013 Yuan ................... G11B 5/6088
369/13.22

(Continued)

FOREIGN PATENT DOCUMENTS

CN     1482709 A    3/2004
CN    201029134 Y   2/2008

(Continued)

OTHER PUBLICATIONS

Original and English machine translation of Taiwanese Office Action issued for corresponding TW Application No. 110118931, dated Oct. 5, 2022.

*Primary Examiner* — Truc T Nguyen
(74) *Attorney, Agent, or Firm* — Renner, Otto, Boisselle & Sklar, LLP

(57) ABSTRACT

A housing has a first positioning hole that penetrates the housing in the vertical direction. A suction cap includes a suction plate part to be sucked by a suction nozzle, and a plurality of positioning protrusion parts, each of which is to be inserted into a first positioning hole of the housing of an input/output board-side connector and a CPU board-side connector in the state where the suction cap holds the input/output board-side connector and the CPU board-side connector. Each positioning protrusion part is inserted into each corresponding first positioning hole in the state where the suction cap holds the input/output board-side connector and the CPU board-side connector, which achieves the positioning of the input/output board-side connector and the CPU board-side connector with respect to the suction cap.

11 Claims, 15 Drawing Sheets

(56) References Cited

U.S. PATENT DOCUMENTS

| | | | |
|---|---|---|---|
| 2004/0023523 A1 | 2/2004 | Ashman et al. | |
| 2008/0242138 A1 | 10/2008 | Chang | |
| 2009/0017644 A1* | 1/2009 | Fan | H01R 43/205 |
| | | | 439/42 |
| 2011/0059624 A1* | 3/2011 | Saito | H05K 3/303 |
| | | | 439/41 |
| 2018/0183176 A1* | 6/2018 | Liao | H01R 13/506 |
| 2019/0379156 A1* | 12/2019 | Aoki | H01R 43/205 |

FOREIGN PATENT DOCUMENTS

| | | |
|---|---|---|
| JP | H1140243 A | 2/1999 |
| WO | 9904462 A1 | 1/1999 |

* cited by examiner

CONNECTOR ASSEMBLY

INCORPORATION BY REFERENCE

This application is based upon and claims the benefit of priority from Japanese patent application No. 2020-133128, filed on Aug. 5, 2020, the disclosure of which is incorporated herein in its entirety by reference.

BACKGROUND

The present disclosure relates to a connector assembly.

Patent Literature 1 (Japanese Unexamined Patent Application Publication No. H11-40243) discloses an electric connector assembly 103 that includes a first electric connector 100, a second electric connector 101, and a cap 102 made of resin as shown in FIG. 15 of the present application.

The cap 102 includes a first cap part 104 to hold the first electric connector 100 and a second cap part 105 to hold the second electric connector 101.

The first cap part 104 has a groove 107 which a mating part 106 of the first electric connector 100 is to mate with. Likewise, the second cap part 105 has a groove 109 which a mating part 108 of the second electric connector 101 is to mate with.

Then, by mating the mating part 106 of the first electric connector 100 with the groove 107 of the first cap part 104, and mating the mating part 108 of the second electric connector 101 with the groove 109 of the second cap part 105, the cap 102 aligns the first electric connector 100 and the second electric connector 101 and also simultaneously holds the first electric connector 100 and the second electric connector 101.

SUMMARY

In the structure of Patent Literature 1 described above, the two connectors are simultaneously held by the cap, and further highly accurate positioning of each connector with respect to the cap is achieved. However, with the miniaturization of electronic equipment on which connectors are to be mounted, it is demanded to reduce the height of connectors.

Thus, an object of the present disclosure is to provide a technique to achieve both the positioning of a plurality of connectors with respect to a suction cap and the reduction of the height of the plurality of connectors.

According to an aspect of the present disclosure, there is provided a connector assembly including a plurality of connectors, and a suction cap capable of holding the plurality of connectors when surface-mounting the plurality of connectors, apart from each other, onto a connector mounting surface of a board, wherein each of the connectors includes a plurality of contacts and a flat-plate housing that holds the plurality of contacts, the housing of each of the connectors has a positioning hole that penetrates the housing in a thickness direction of the housing, the suction cap includes a suction plate part to be sucked by a suction nozzle, and a plurality of positioning protrusion parts, each to be inserted into the positioning hole of the housing of each of the plurality of connectors in a state where the suction cap holds the plurality of connectors, and positioning of each of the connectors with respect to the suction cap is done by inserting each of the positioning protrusion parts into each corresponding positioning hole in the state where the suction cap holds the plurality of connectors.

According to the present disclosure, the positioning of a plurality of connectors with respect to a suction cap and the reduction of the height of a plurality of connectors are both achieved.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

An embodiment of the present disclosure is described hereinafter with reference to FIGS. 1 to 14.

Figure 1:
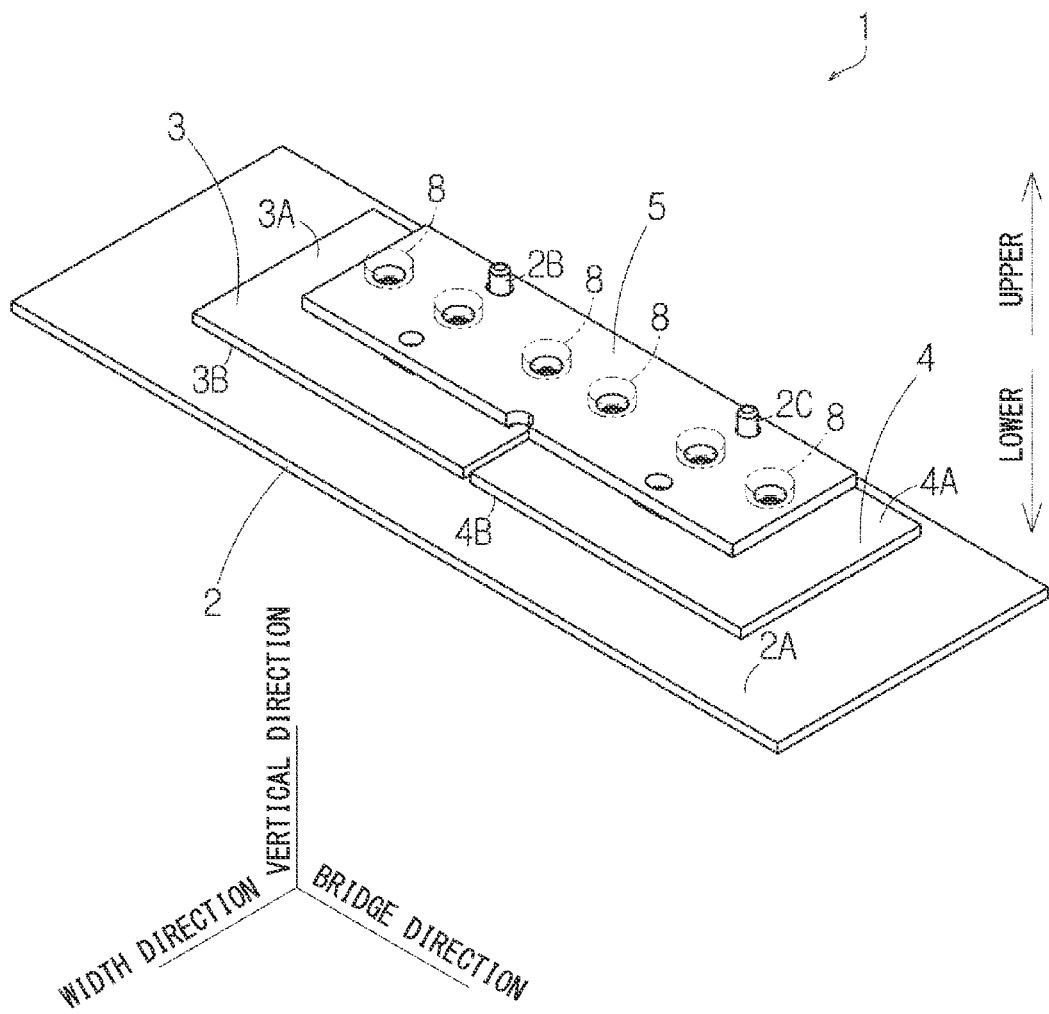
FIG. 1 is a perspective view of an information processing device.
Figure 2:
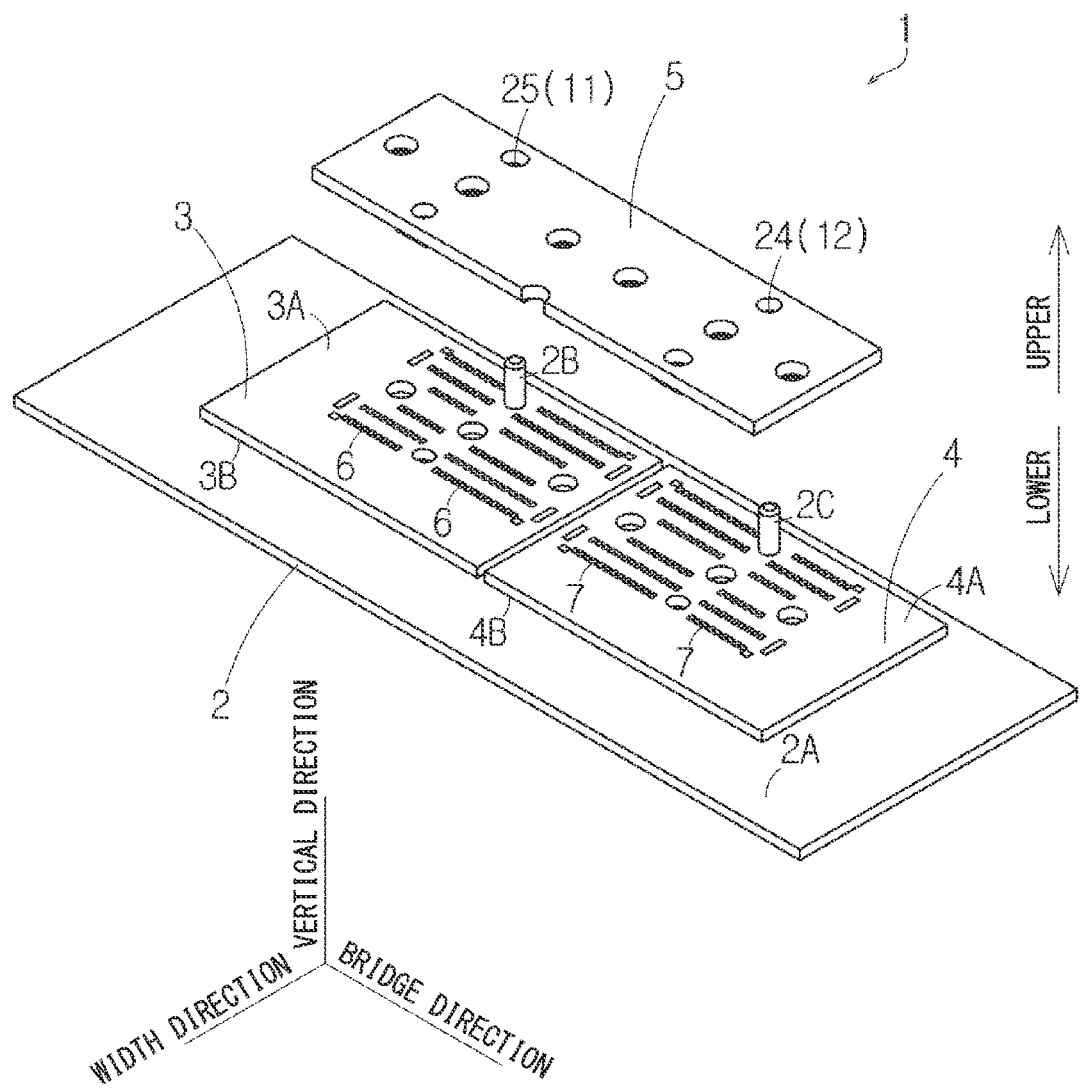
FIG. 2 is an exploded perspective view of the information processing device.

FIGS. 1 and 2 show an information processing device 1. As shown in FIGS. 1 and 2, the information processing device 1 includes a main board 2, an input/output board 3, a CPU board 4, and a bridge board assembly 5.

Each of the main board 2, the input/output board 3, and the CPU board 4 is a rigid board such as a paper phenolic board, a glass composite board, or a glass epoxy board, for example.

The input/output board 3 and the CPU board 4 are disposed on a parts mounting surface 2A of the main board 2, and they are disposed adjacent to each other. In other words, the input/output board 3 and the CPU board 4 are disposed on the parts mounting surface 2A of the main board 2 in such a way that their end faces are opposed to each other.

The input/output board 3 includes a connector opposed surface 3A and a main board opposed surface 3B. The main board opposed surface 3B is opposed to the parts mounting surface 2A of the main board 2. The connector opposed surface 3A is on the opposite side of the main board opposed surface 3B.

The CPU board 4 includes a connector opposed surface 4A and a main board opposed surface 4B. The main board opposed surface 4B is opposed to the parts mounting surface 2A of the main board 2. The connector opposed surface 4A is on the opposite side of the main board opposed surface 4B.

The thicknesses of the input/output board 3 and the CPU board 4 are the same. Thus, the connector opposed surface 3A of the input/output board 3 and the connector opposed surface 4A of the CPU board 4 are in the same plane in the state where the input/output board 3 and the CPU board 4 are disposed on the parts mounting surface 2A of the main board 2.

As shown in FIG. 2, a plurality of pads 6 are formed on the connector opposed surface 3A of the input/output board 3. Likewise, a plurality of pads 7 are formed on the connector opposed surface 4A of the CPU board 4.

The bridge board assembly 5 is configured to electrically connect the plurality of pads 6 to the plurality of pads 7. Thus, the bridge board assembly 5 is disposed to cover the plurality of pads 6 and the plurality of pads 7. Then, the bridge board assembly 5 is drawn toward the main board 2 by using a plurality of bolts 8, which are indicated by chain double-dashed lines in FIG. 1, and thereby the bridge board assembly 5 is pressed against the input/output board 3 and the CPU board 4.

The terms "vertical direction", "bridge direction" and "width direction" are defined by referring to FIGS. 1 and 2. The vertical direction, the bridge direction and the width direction are directions that are orthogonal to one another.

The vertical direction is the direction in which the main board 2, the input/output board 3, and the bridge board assembly 5 overlap. The vertical direction includes an upper direction and a lower direction. The upper direction is the direction of viewing the bridge board assembly 5 from the main board 2. The lower direction is the opposite direction from the upper direction. Thus, the input/output board 3 and the CPU board 4 are disposed on the upper side of the main board 2, and the bridge board assembly 5 is disposed on the upper side of the input/output board 3 and the CPU board 4.

The bridge direction is the direction in which the input/output board 3 and the CPU board 4 are adjacent to each other. Thus, the bridge board assembly 5 is formed to extend in the bridge direction.

The width direction is orthogonal to the vertical direction and the bridge direction as described above.

The structure of the bridge board assembly 5 is described hereinafter in further detail by using the vertical direction, the bridge direction and the width direction defined with reference to FIGS. 1 and 2. It should be noted that, in FIG. 3 and subsequent figures, the bridge board assembly 5 is shown upside down for the sake of convenience of description.

Figure 3:
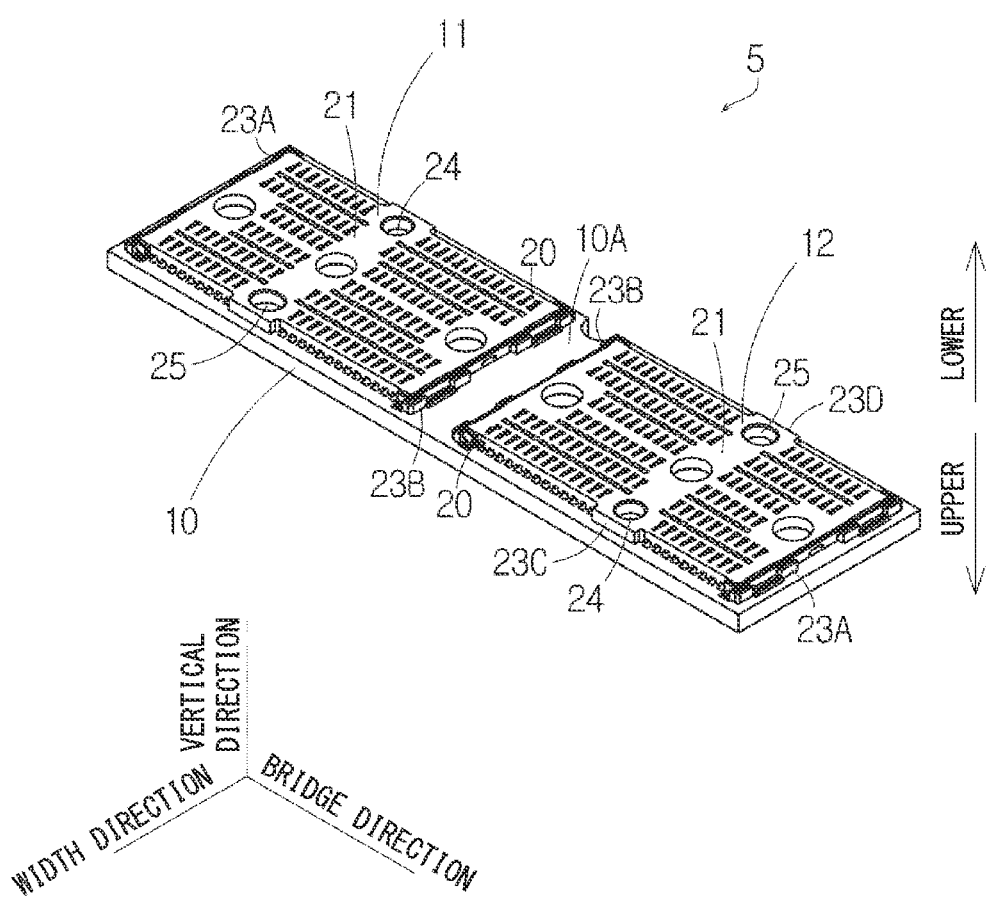
FIG. 3 is a perspective view of a bridge board assembly.
Figure 4:
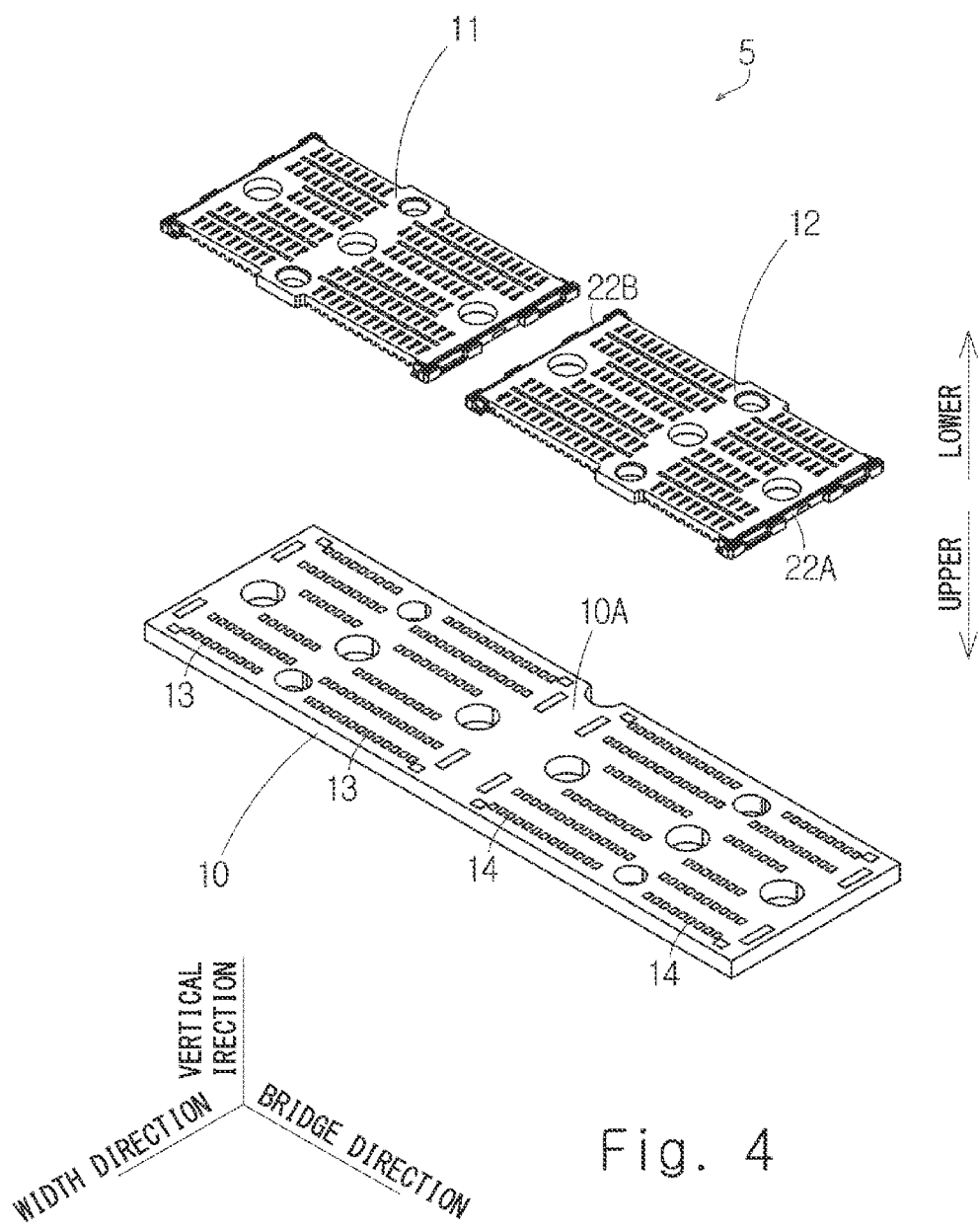
FIG. 4 is an exploded perspective view of the bridge board assembly.

FIGS. 3 and 4 show the bridge board assembly 5. As shown in FIGS. 3 and 4, the bridge board assembly 5 includes a bridge board 10 (board), an input/output board-side connector 11 (connector), and a CPU board-side connector 12 (connector).

The bridge board 10 is a rigid board such as a paper phenolic board, a glass composite board, or a glass epoxy board, for example. The bridge board 10 includes a connector mounting surface 10A. As shown in FIG. 4, on the connector mounting surface 10A, a plurality of pads 13 corresponding to the input/output board-side connector 11 and a plurality of pads 14 corresponding to the CPU board-side connector 12 are formed. The plurality of pads 13 and the plurality of pads 14 are respectively connected to each other by some patterns, which are not shown.

The input/output board-side connector 11 is surface-mounted on the connector mounting surface 10A of the bridge board 10 so as to cover the plurality of pads 13. The CPU board-side connector 12 is surface-mounted on the connector mounting surface 10A of the bridge board 10 so as to cover the plurality of pads 14.

As shown in FIGS. 2, 3 and 4, the input/output board-side connector 11 is a board-to-board connector that is interposed between the bridge board 10 and the input/output board 3 and thereby electrically connects the plurality of pads 13 formed on the connector mounting surface 10A of the bridge board 10 and the plurality of pads 6 formed on the connector opposed surface 3A of the input/output board 3, respectively.

Likewise, the CPU board-side connector 12 is a board-to-board connector that is interposed between the bridge board 10 and the CPU board 4 and thereby electrically connects the plurality of pads 14 formed on the connector mounting surface 10A of the bridge board 10 and the plurality of pads 7 formed on the connector opposed surface 4A of the CPU board 4, respectively.

Thus, the input/output board-side connector 11 and the CPU board-side connector 12 are formed in a substantially flat shape.

In this embodiment, the input/output board-side connector 11 and the CPU board-side connector 12 have the same shape mainly for the purpose of cost reduction. Therefore, the CPU board-side connector 12 is mainly described hereinafter, and the description of the input/output board-side connector 11 is omitted as appropriate. The CPU board-side connector 12 is also referred to simply as the connector 12 hereinbelow.

Figure 5:
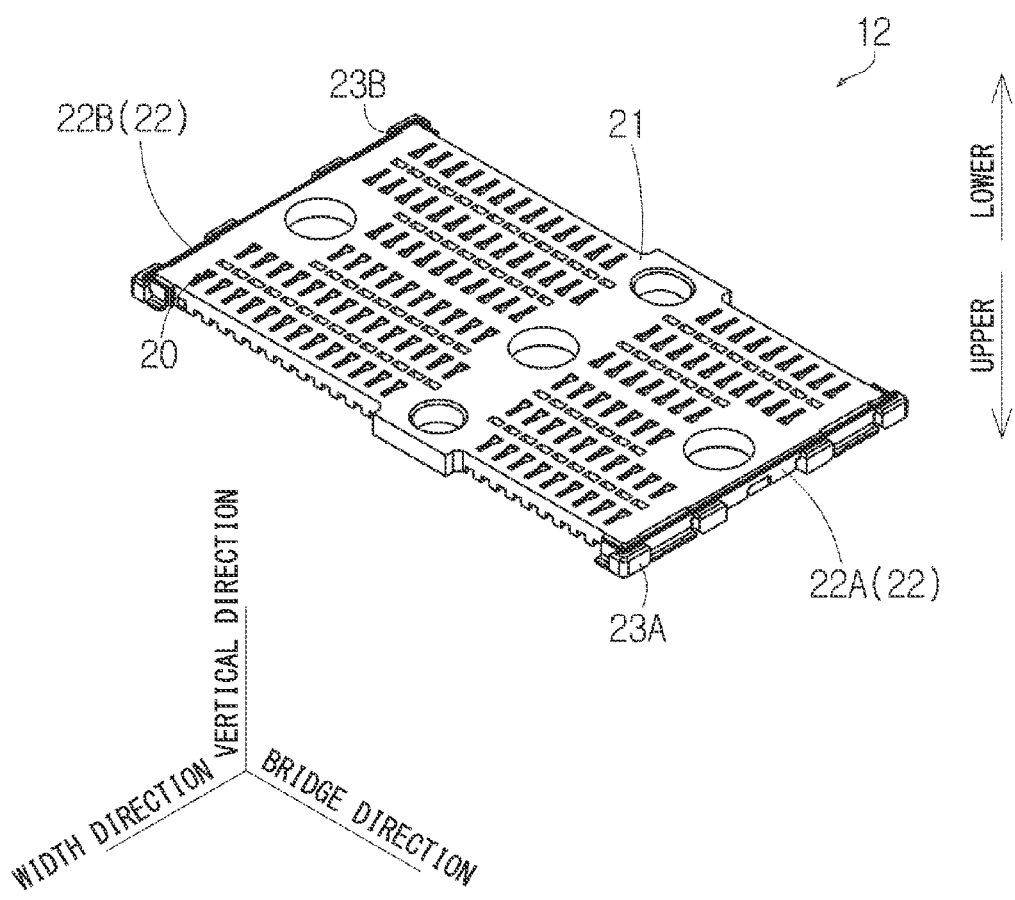
FIG. 5 is a perspective view of a connector.
Figure 6:
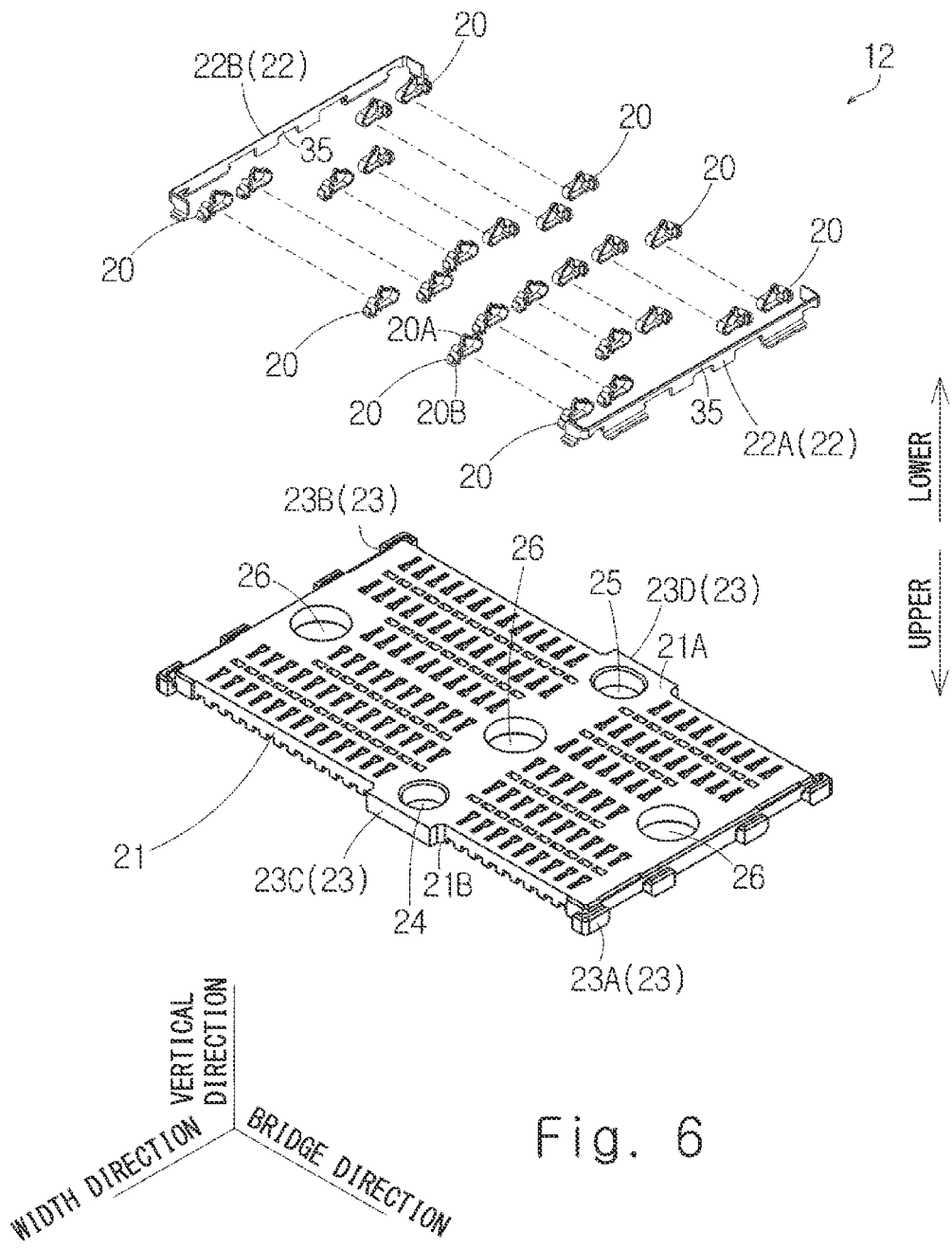
FIG. 6 is an exploded perspective view of the connector.
Figure 7:
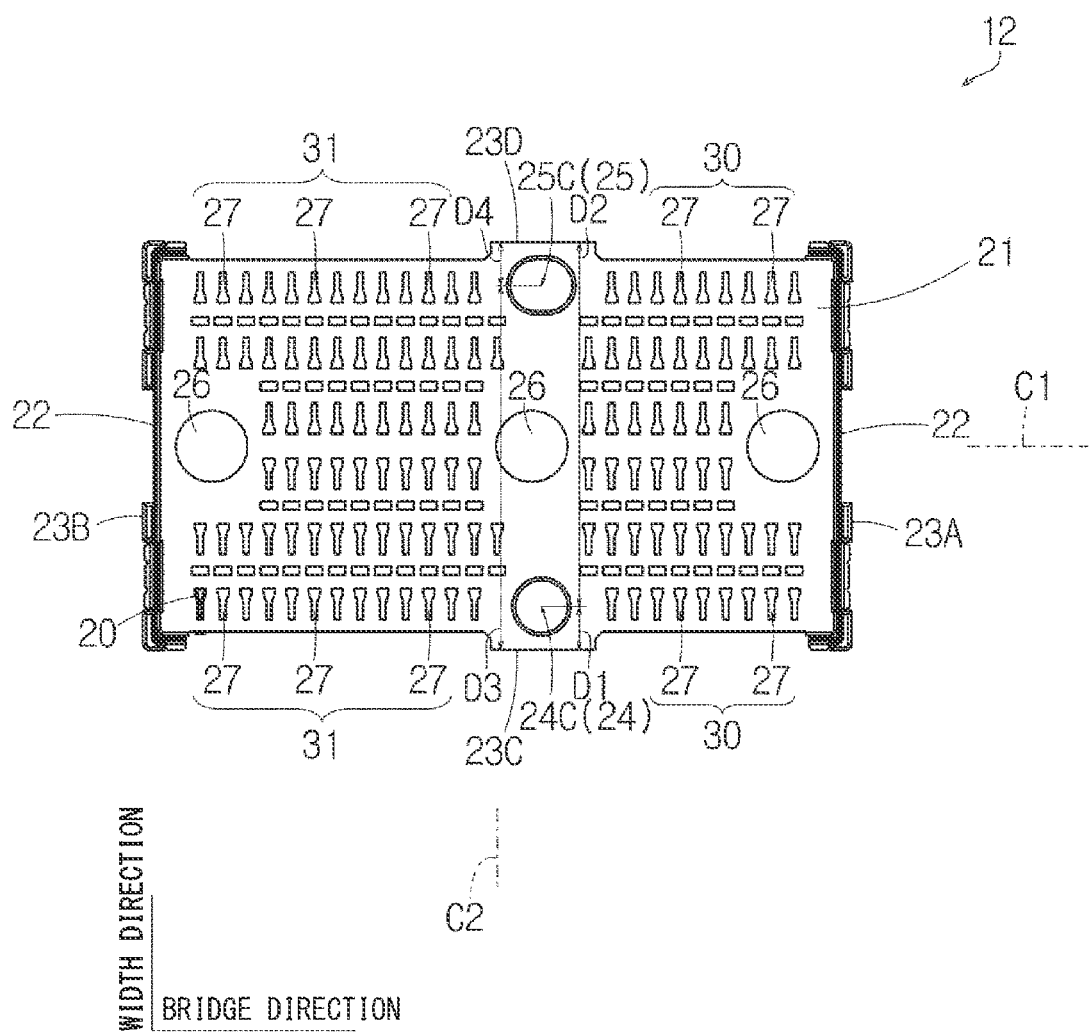
FIG. 7 is a plan view of the connector.

FIGS. 5 to 7 show the connector 12. As shown in FIGS. 5 and 6, the connector 12 includes a plurality of contacts 20, a rectangular flat-plate housing 21 that holds the plurality of contacts 20, and two hold-downs 22.

Note that, in FIGS. 5 and 7, only one of the plurality of contacts 20 is shown. In FIG. 6, some of the plurality of contacts 20 are shown by long dashed short dashed lines.

As shown in FIG. 7, the connector 12 is formed to be symmetric with respect to a center line C1 that divides the connector 12 in half in the width direction. The connector 12 is formed to be asymmetric with respect to a center line C2 that divides the connector 12 in half in the bridge direction.

As shown in FIG. 6, the housing 21 is made of insulating resin and formed in a rectangular flat-plate shape. Thus, the housing 21 includes a lower surface 21A and an upper surface 21B. Further, the housing 21 includes four end faces 23. The four end faces 23 include a first bridge end face 23A, a second bridge end face 23B, a first width end face 23C, and a second width end face 23D. The first bridge end face 23A and the second bridge end face 23B face opposite directions and orthogonal to the bridge direction. The first width end face 23C and the second width end face 23D face opposite directions and orthogonal to the width direction.

The housing 21 has a first positioning hole 24 (positioning hole), a second positioning hole 25, and three bolt holes 26. Each of the first positioning hole 24, the second positioning hole 25, and the three bolt holes 26 is a penetrating hole that penetrates the housing 21 in the thickness direction of the housing 21, which is the vertical direction.

As shown in FIG. 7, the first positioning hole 24 and the second positioning hole 25 are formed at the center of the housing 21 in the bridge direction. The first positioning hole 24 and the second positioning hole 25 are formed apart from each other in the width direction.

The first positioning hole 24 is formed in a true circle shape.

The second positioning hole 25 is a slotted hole extending in the bridge direction, which has a track shape used for track and field.

The first positioning hole 24 is formed closer to the first width end face 23C than to the second width end face 23D. Specifically, when the housing 21 is viewed from above, a distance D1 from a center point 24C of the first positioning hole 24 to the first width end face 23C in the width direction is shorter than a distance D2 from the center point 24C of the first positioning hole 24 to the second width end face 23D in the width direction.

Likewise, the second positioning hole 25 is formed closer to the second width end face 23D than to the first width end face 23C. Specifically, when the housing 21 is viewed from above, a distance D3 from a center point 25C of the second positioning hole 25 to the first width end face 23C in the width direction is longer than a distance D4 from the center point 25C of the second positioning hole 25 to the second width end face 23D in the width direction.

The three bolt holes 26 are bolt holes into which the plurality of bolts 8 shown in FIG. 1 are to be inserted. As shown in FIG. 7, the three bolt holes 26 are formed at the center of the housing 21 in the width direction. The three bolt holes 26 are formed apart from one another in the bridge direction. One of the three bolt holes 26 is formed near the first bridge end face 23A, one is formed near the second bridge end face 23B, and the remaining one is formed at the center in the bridge direction and between the first positioning hole 24 and the second positioning hole 25.

In the housing 21, a plurality of contact accommodation parts 27 are formed. The plurality of contact accommodation parts 27 are parts to accommodate the plurality of contacts 20, respectively. Each of the contact accommodation parts 27 is formed to penetrate the housing 21 in the vertical direction.

The plurality of contact accommodation parts 27 are arranged to form six first accommodation rows 30 on the first bridge end face 23A side and six second accommodation rows 31 on the second bridge end face 23B side. Each of the six first accommodation rows 30 and the six second accommodation rows 31 lies in the bridge direction. The six first accommodation rows 30 are formed apart from one another in the width direction. The six first accommodation rows 30 are formed apart from one another in the width direction.

Referring back to FIG. 6, each of the contacts 30 is formed by punching and bending a metal plate formed by plating copper or copper alloy, for example. Each contact 20 is press-fit into each contact accommodation part 27 and thereby held by the housing 21. Each contact 20 includes a contact part 20A that projects downward from the lower surface 21A of the housing 21 and a soldering part 20B that projects upward from the upper surface 21B of the housing 21 when held by the housing 21. The contact part 20A of each contact 20 elastically comes into contact with a corresponding pad 7 of CPU board 4 shown in FIG. 2. The soldering part 20B of each contact 20 is soldered to a corresponding pad 14 of the bridge board 10 shown in FIG. 4.

Referring back to FIG. 6, the two hold-downs 22 include a first hold-down 22A to be attached to the first bridge end face 23A of the housing 21, and a second hold-down 22B to be attached to the second bridge end face 23B of the housing 21. The first hold-down 22A and the second hold-down 22B are formed by punching and bending a metal plate formed by plating copper or copper alloy, for example. The first hold-down 22A and the second hold-down 22B are soldered to the corresponding pad 13 and pad 14 of the bridge board 10 shown in FIG. 4 and thereby fix the connector 12 to the connector mounting surface 10A of the bridge board 10.

Referring back to FIG. 6, the first hold-down 22A and the second hold-down 22B extend in the width direction. A locking part 35 is formed at the center of the first hold-down 22A and the second hold-down 22B in the width direction.

Figure 8:
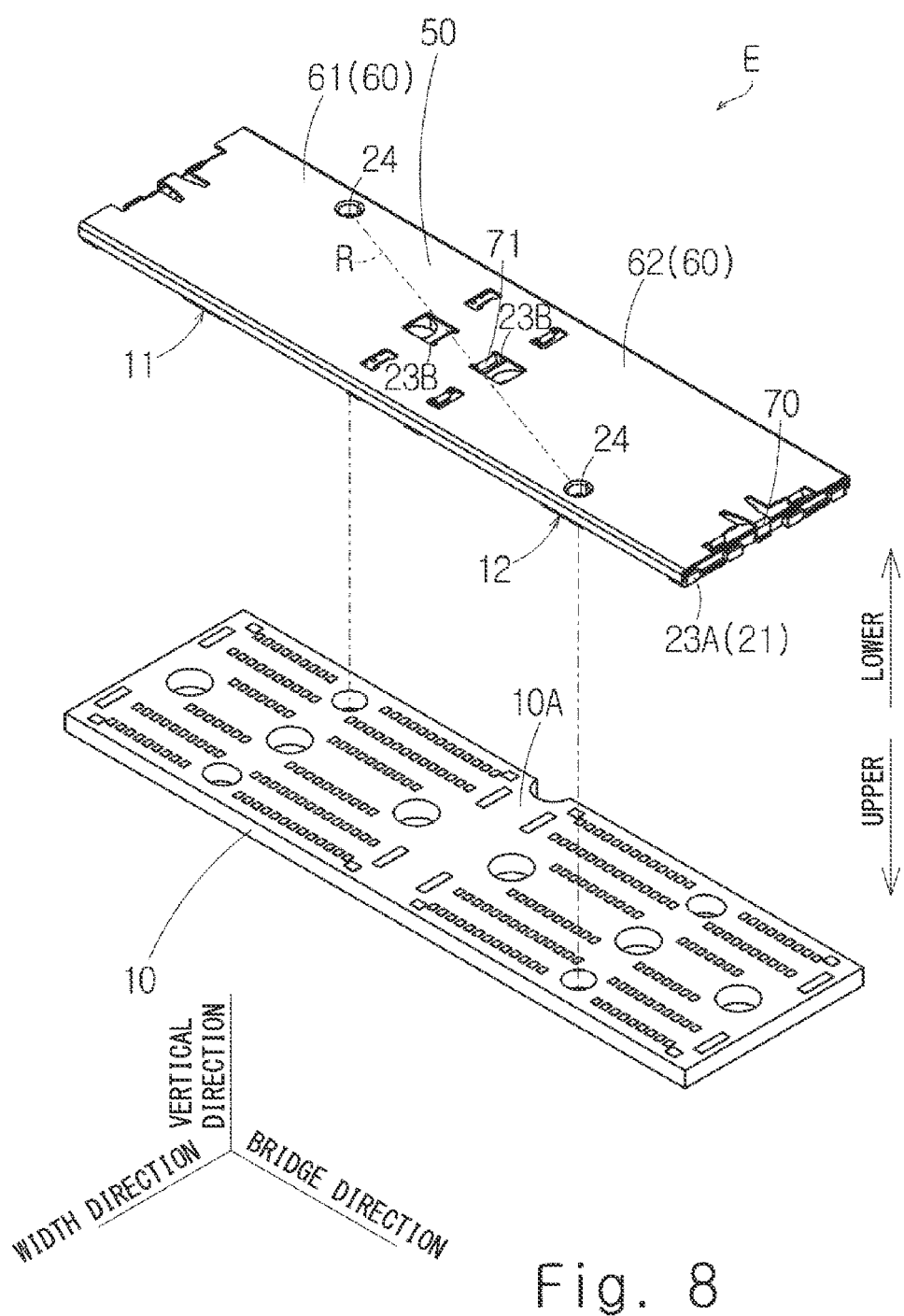
FIG. 8 is a perspective view showing the way two connectors are held by a suction cap and mounted on a bridge board.

As shown in FIG. 8, when surface-mounting the input/output board-side connector 11 and the CPU board-side connector 12 onto the connector mounting surface 10A of the bridge board 10, a suction cap 50 is used so as to simultaneously hold the input/output board-side connector 11 and the CPU board-side connector 12 by one suction nozzle. Specifically, the suction cap 50 is used in order to provisionally hold the input/output board-side connector 11 and the CPU board-side connector 12 when surface-mounting the input/output board-side connector 11 and the CPU board-side connector 12, apart from each other, onto the connector mounting surface 10A of the bridge board 10.

In this embodiment, a connector assembly E at least includes the input/output board-side connector 11, the CPU board-side connector 12, and the suction cap 50.

As shown in FIG. 3, the input/output board-side connector 11 and the CPU board-side connector 12 are surface-mounted on the connector mounting surface 10A of the bridge board 10 in different orientations. The input/output board-side connector 11 and the CPU board-side connector 12 are surface-mounted on the connector mounting surface 10A of the bridge board 10 in opposite orientations. Specifically, in the state where the input/output board-side connector 11 and the CPU board-side connector 12 are surface-mounted on the connector mounting surface 10A of the bridge board 10, the second bridge end face 23B of the housing 21 of the input/output board-side connector 11 and the second bridge end face 23B of the housing 21 of the CPU board-side connector 12 are opposed to each other in the bridge direction. Thus, the suction cap 50 shown in FIG. 8 holds the input/output board-side connector 11 and the CPU board-side connector 12 in such a way that the second bridge end face 23B of the housing 21 of the input/output board-side connector 11 and the second bridge end face 23B of the housing 21 of the CPU board-side connector 12 are opposed to each other.

The suction cap 50 is described hereinafter in detail with reference to FIGS. 8 to 14.

Figure 9:
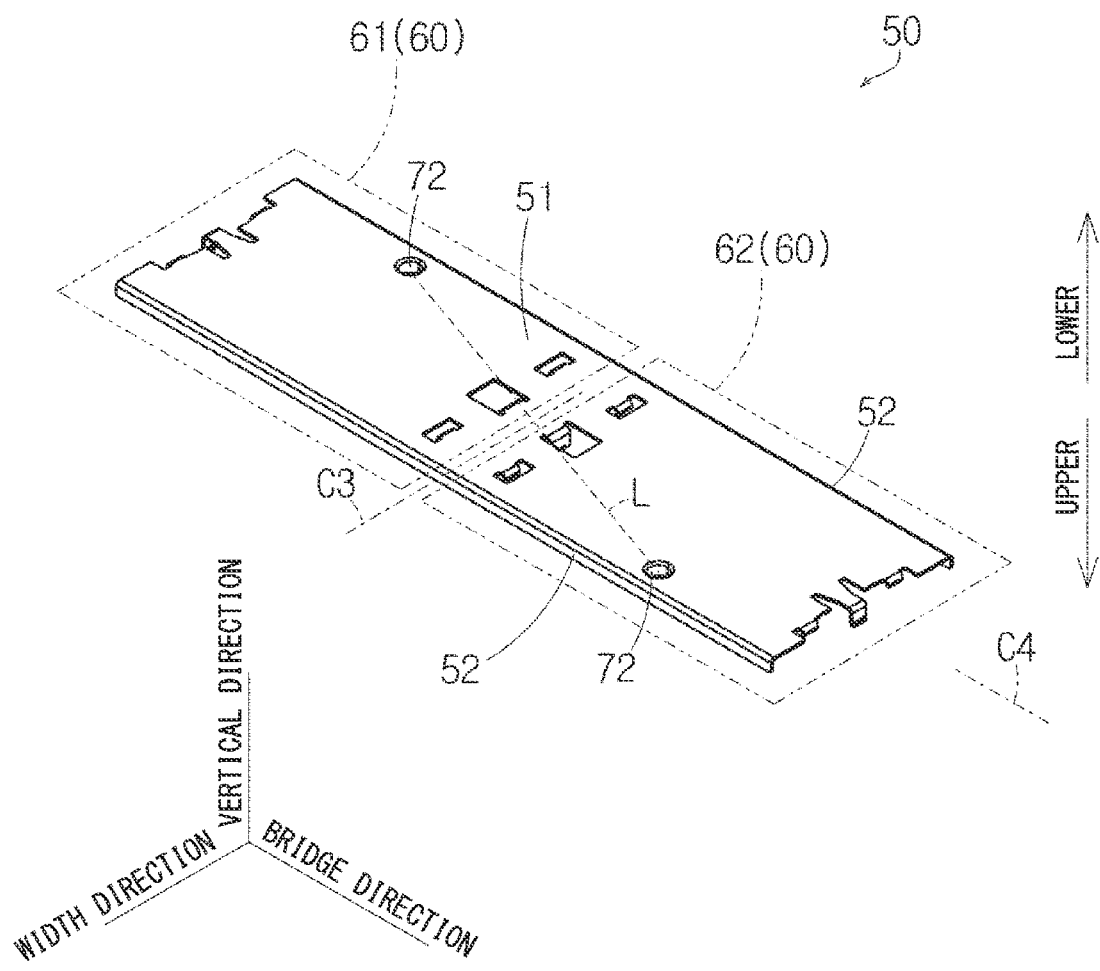
FIG. 9 is a perspective view of the suction cap.

As shown in FIG. 8, the suction cap 50 is formed extending in the bridge direction in order to simultaneously hold the input/output board-side connector 11 and the CPU board-side connector 12 that are adjacent to each other in the bridge direction. The suction cap 50 is formed by punching and bending a metal sheet such as a stainless thin sheet, for example. As shown in FIG. 9, the suction cap 50 includes a suction plate part 51 and two side walls 52.

The suction plate part 51 is in a flat plate shape and orthogonal to the vertical direction.

The two side walls 52 are in a flat plate shape, and project upward from both ends of the suction plate part 51 in the width direction, respectively. Each of the side walls 52 extends in the bridge direction. Each of the side walls 52 continuously extends from one end to the other end of the suction plate part 51 in the bridge direction.

The suction cap 50 includes two cap parts 60 that are adjacent to each other with a center line C3, which divides the suction cap 50 in half in the bridge direction, lying therebetween. The two cap parts 60 include an input/output board-side cap part 61 for holding the input/output board-side connector 11 and a CPU board-side cap part 62 for holding the CPU board-side connector 12. Thus, the input/output board-side cap part 61 and the CPU board-side cap part 62 are adjacent to each other with the center line C3 lying therebetween in the bridge direction.

The input/output board-side cap part 61 and the CPU board-side cap part 62 are substantially line-symmetric with respect to the center line C3, and therefore the CPU board-side cap part 62 is first described hereinbelow.

Figure 10:
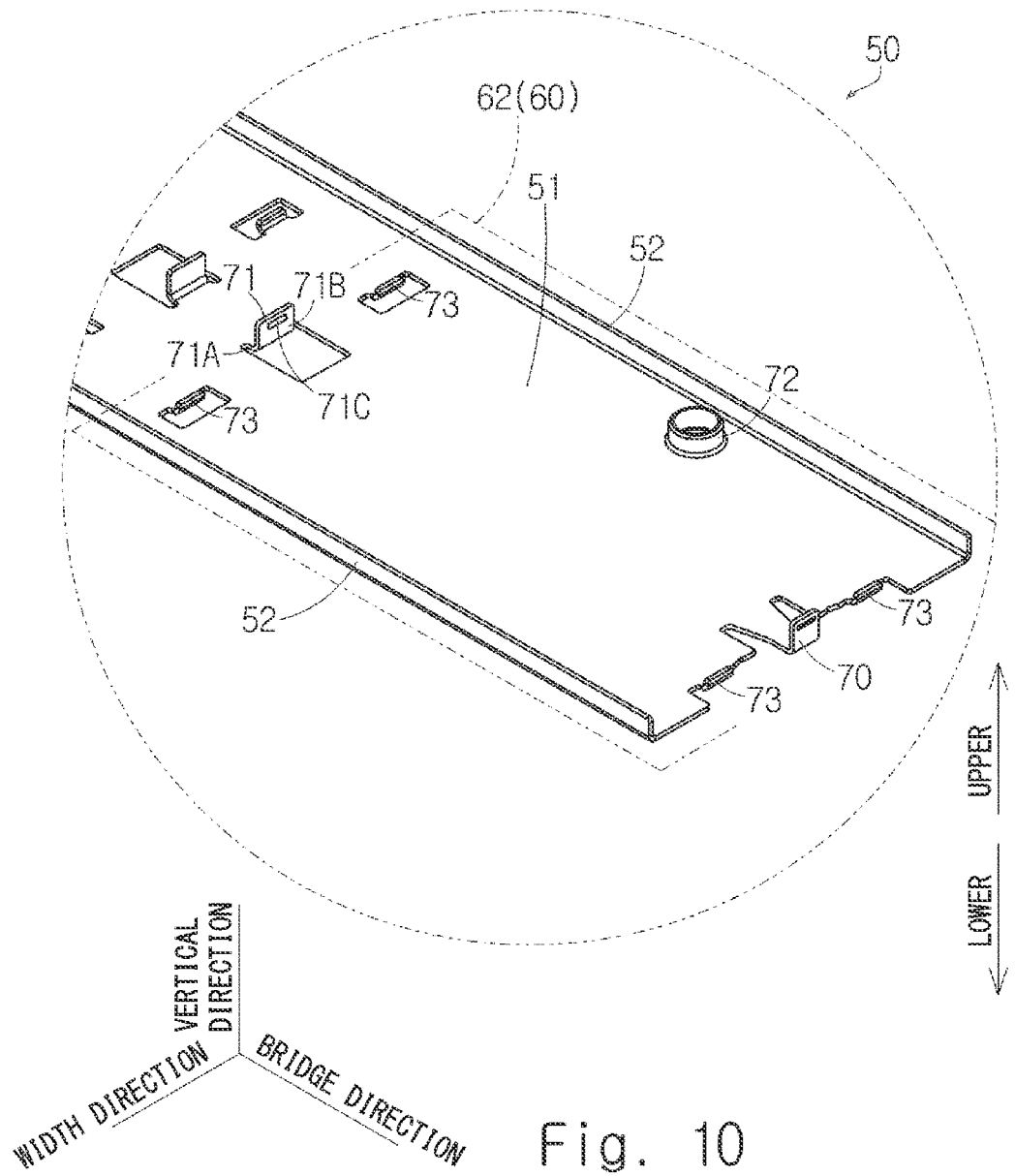
FIG. 10 is a partial perspective view of the suction cap viewed from another angle.

As shown in FIG. 10, in the CPU board-side cap part 62, a first locking elastic piece 70 (locking elastic piece), a second locking elastic piece 71, a positioning protrusion part 72, and four spacer parts 73 are formed by cutting and bending in the suction plate part 51.

Each of the first locking elastic piece 70 and the second locking elastic piece 71 is a cantilever beam supported by the suction plate part 51, and formed to project upward from the suction plate part 51.

As shown in FIG. 8, the first locking elastic piece 70 is disposed to correspond to the first bridge end face 23A of the housing 21 of the CPU board-side connector 12. The second locking elastic piece 71 is disposed to correspond to the second bridge end face 23B of the housing 21 of the CPU board-side connector 12.

Figure 11:
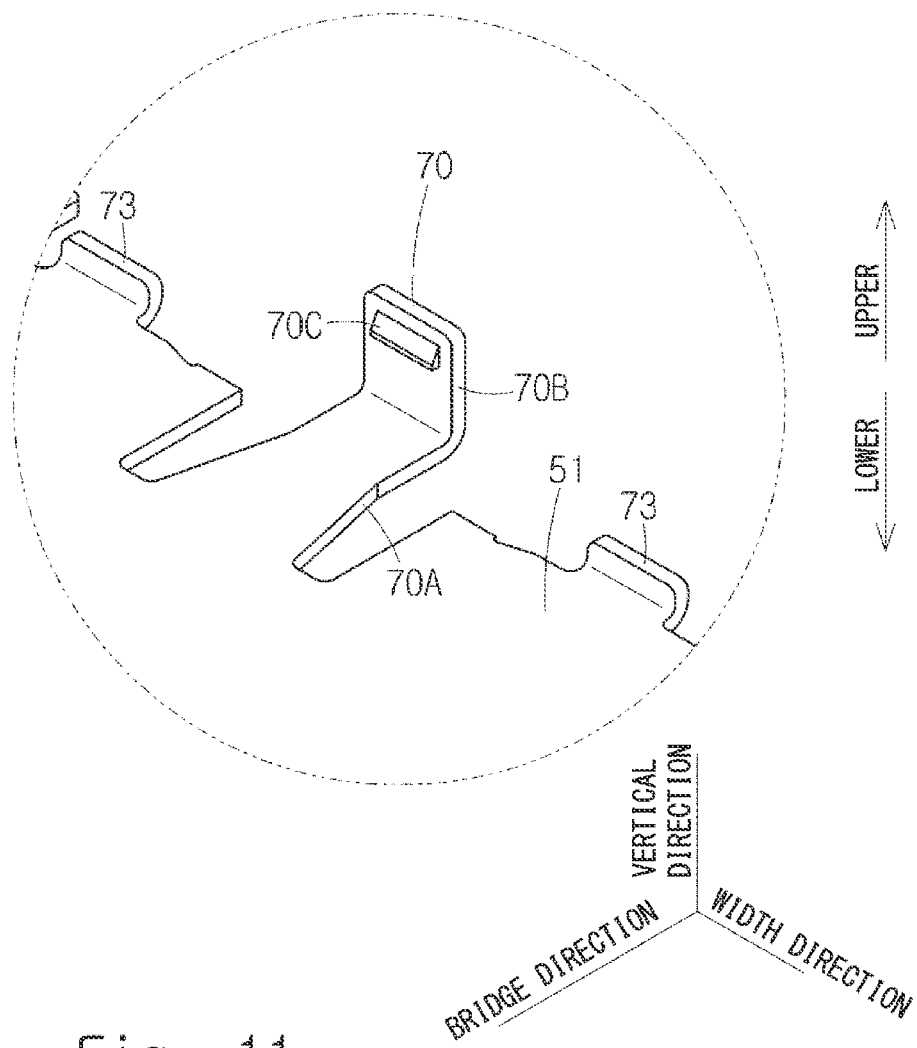
FIG. 11 is a perspective view of a first locking elastic piece.

As shown in FIG. 11, the first locking elastic piece 70 includes a horizontal beam part 70A that extends from the suction plate part 51 in the bridge direction, a vertical beam part 70B that projects upward from the end of the horizontal beam part 70A, and a locking lance part 70C that projects from the vertical beam part 70B in the bridge direction. The horizontal beam part 70A and the vertical beam part 70B extend to form an L shape. Thus, the thickness direction of the vertical beam part 70B is the same as the bridge direction. The horizontal beam part 70A has a sufficient length in the bridge direction so that the vertical beam part 70B and the locking lance part 70C are slightly displaceable in the bridge direction. The locking lance part 70C projects toward the second locking elastic piece 71.

Referring back to FIG. 10, the second locking elastic piece 71 includes a horizontal beam part 71A that extends from the suction plate part 51 in the bridge direction, a vertical beam part 71B that projects upward from the end of the horizontal beam part 71A, and a locking lance part 71C that projects from the vertical beam part 71B in the bridge direction. The horizontal beam part 71A and the vertical beam part 71B extend to form an L shape. Thus, the thickness direction of the vertical beam part 71B is the same as the bridge direction. The horizontal beam part 71A has a sufficient length in the bridge direction so that the vertical beam part 71B and the locking lance part 71C are slightly displaceable in the bridge direction. The locking lance part 71C projects toward the first locking elastic piece 70.

The positioning protrusion part 72 is disposed to correspond to the first positioning hole 24 of the housing 21 of the CPU board-side connector 12 shown in FIG. 3. As shown in FIG. 10, the positioning protrusion part 72 projects upward from the suction plate part 51 in a cylindrical shape. The positioning protrusion part 72 is formed in a true circle shape, just like the first positioning hole 24. The positioning protrusion part 72 is formed on the suction plate part 51 typically by drawing. Alternatively, the positioning protrusion part 72 may be a cylindrical part prepared by another process and weld to the suction plate part 51.

Figure 12:
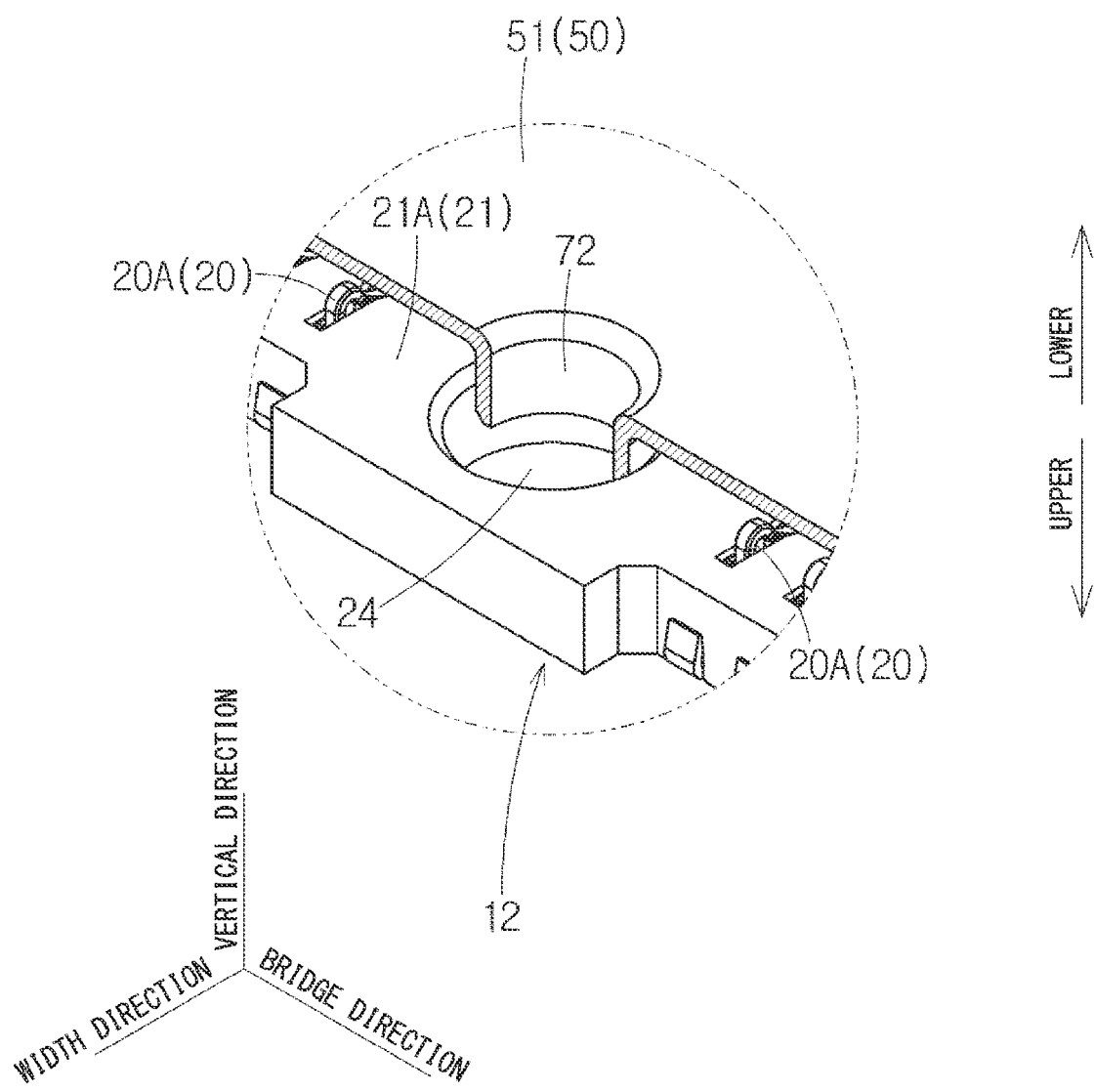
FIG. 12 is a cross-sectional perspective view of a positioning protrusion part inserted into a positioning hole.

As shown in FIG. 12, the positioning protrusion part 72 is inserted into the corresponding first positioning hole 24 in the state where the suction cap 50 holds the CPU board-side connector 12, which enables the positioning of the CPU board-side connector 12 with respect to the suction cap 50 in the bridge direction and the width direction.

(Holding State)

A holding state where the suction cap 50 is holding the CPU board-side connector 12 is descried hereinafter in detail.

As shown in FIG. 10, the four spacer parts 73 are formed to project upward from the suction plate part 51. In the above-described holding state, the four spacer parts 73 are disposed to be opposed to the lower surface 21A of the housing 21 of the CPU board-side connector 12 shown in FIG. 6 in the vertical direction. By providing the suction plate part 51 with the four spacer parts 73 in this manner, an appropriate clearance is left between the lower surface 21A of the housing 21 and the suction plate part 51 in the above-described holding state as shown in FIG. 12. This prevents the contact part 20A of each contact 20 from colliding with the suction plate part 51 and being damaged due to the inertia of the CPU board-side connector 12 when sucking the suction cap 50 by a suction nozzle.

Figure 13:
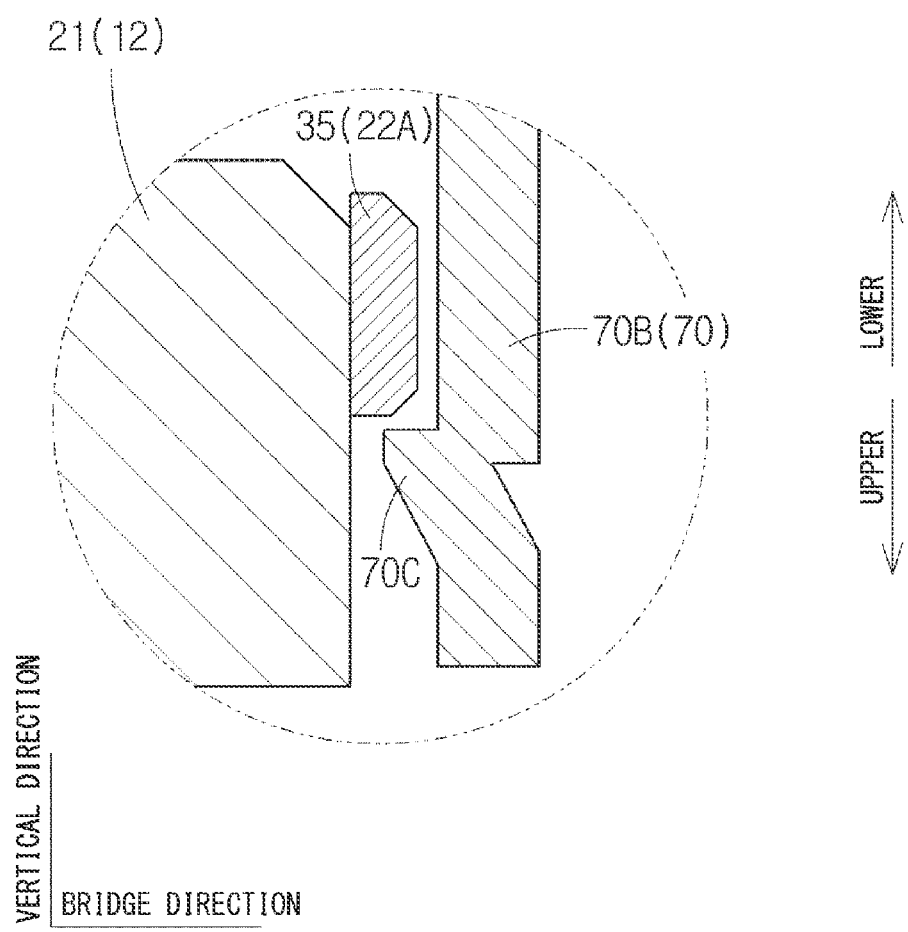
FIG. 13 is an end view of the first locking elastic piece catching on a locking part.
Figure 14:
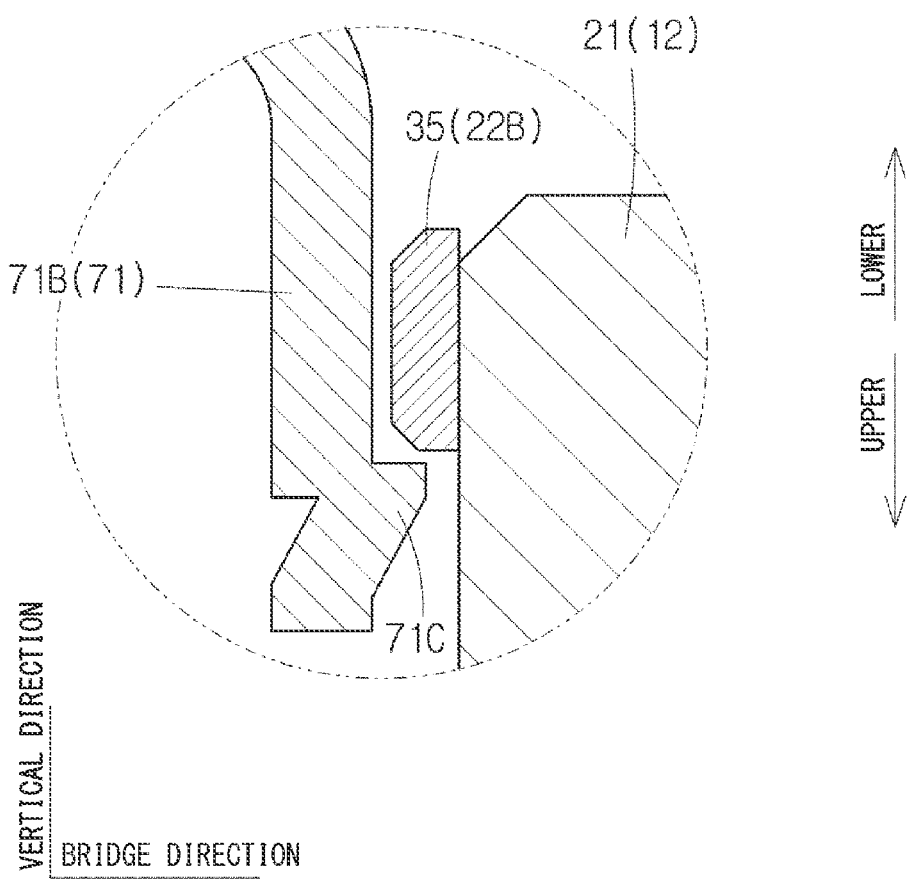
FIG. 14 is an end view of a second locking elastic piece catching on a locking part.
Figure 15:
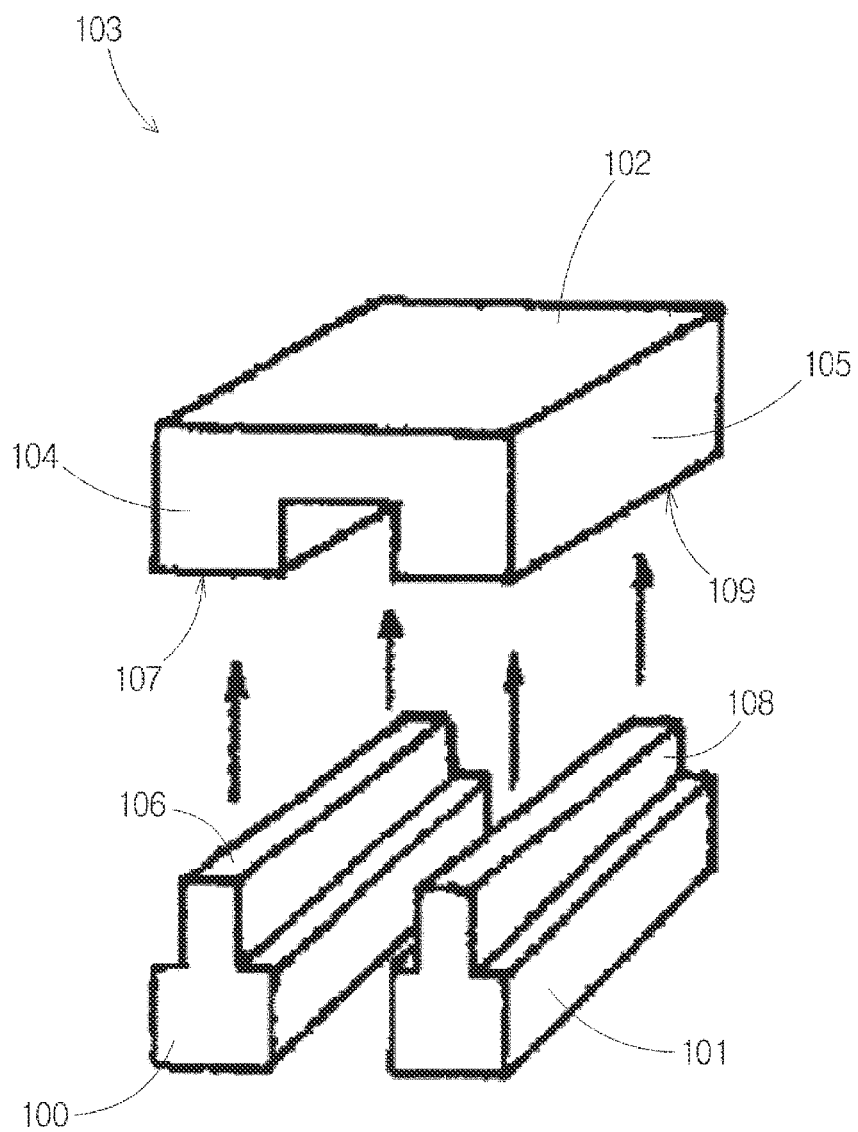
FIG. 15 is a view showing a simplified version of FIG. 1 of Japanese Unexamined Patent Application Publication No. H11-40243.

FIGS. 13 and 14 show end views of the above-described holding state. FIG. 13 shows the state where the first locking elastic piece 70 is catching on the locking part 35 of the first hold-down 22A. FIG. 14 shows the state where the second locking elastic piece 71 is catching on the locking part 35 of the second hold-down 22B. As shown in FIGS. 13 and 14, the first locking elastic piece 70 catches on the locking part 35 of the first hold-down 22A, and the second locking elastic piece 71 catches on the locking part 35 of the second hold-down 22B, so that the suction cap 50 holds the CPU board-side connector 12. In this state, as shown in FIG. 13, the vertical beam part 70B of the first locking elastic piece 70 is opposed to the locking part 35 of the first hold-down 22A in the bridge direction. Note that, however, in the above-described holding state, the locking part 35 and the first locking elastic piece 70 are not constantly in contact with each other, and the first locking elastic piece 70 is relatively movable with respect to the locking part 35 in the vertical direction and the bridge direction. Likewise, as shown in FIG. 14, the vertical beam part 71B of the second locking elastic piece 71 is opposed to the locking part 35 of the second hold-down 22B in the bridge direction. Note that, however, in the above-described holding state, the locking part 35 and the second locking elastic piece 71 are not constantly in contact with each other, and the second locking elastic piece 71 is relatively movable with respect to the locking part 35 in the vertical direction and the bridge direction.

Further, in the above-described holding state, the two side walls 52 shown in FIG. 9 are respectively opposed to the first width end face 23C and the second width end face 23D of the housing 21 of the CPU board-side connector 12 shown in FIG. 6 with a slight gap in the width direction.

Thus, even if the suction plate part 51 of the suction cap 50 is warped, it is possible to align the postures of the input/output board-side connector 11 and the CPU board-side connector 12 shown in FIG. 3. To be more specific, a soldering reference surface of the input/output board-side connector 11 that can be defined by the bottom surface of the soldering part 20B of the plurality of contacts 20 of the input/output board-side connector 11 and a soldering reference surface of the CPU board-side connector 12 that can be defined by the bottom surface of the soldering part 20B of the plurality of contacts 20 of the CPU board-side connector 12 are in-plane. Therefore, even if the suction plate part 51 of the suction cap 50 is warped, the input/output board-side connector 11 and the CPU board-side connector 12 are allowed to be surface-mounted on the connector mounting surface 10A of the bridge board 10 with no problem in the above-described holding state.

Note that the cancellation of warpage of the suction plate part 51 in the bridge direction is achieved in the above-described holding state as long as at least any one of the first locking elastic piece 70 and the second locking elastic piece 71 is movable in the vertical direction with respect to the locking part 35 of the first hold-down 22A or the second hold-down 22B of the CPU board-side connector 12.

(Positioning)

Next, the positioning of the CPU board-side connector 12 with respect to the suction cap 50 in the bridge direction and the width direction is described hereinafter.

In FIG. 10, even when the suction cap 50 is not provided with the positioning protrusion part 72, the positioning of the CPU board-side connector 12 with respect to the suction cap 50 in the bridge direction and the width direction is achieved to a certain level by the first locking elastic piece 70, the second locking elastic piece 71, and the two side walls 52. However, since the first locking elastic piece 70 is required to be detachable from the locking part 35, the vertical beam part 70B of the first locking elastic piece 70 needs to be relatively easily displaceable in the bridge direction. Therefore, the first locking elastic piece 70 cannot be expected to enable the positioning of the CPU board-side connector 12 with respect to the suction cap 50 in the bridge direction. The same applies to the second locking elastic piece 71.

Thus, in the CPU board-side cap part 62, the suction cap 50 according to this embodiment is provided with the positioning protrusion part 72 to be inserted into the first positioning hole 24 of the CPU board-side connector 12. This achieves highly accurate positioning of the CPU board-side connector 12 with respect to the suction cap 50 in the width direction and the bridge direction.

Likewise, in the input/output board-side cap part 61, the suction cap 50 according to this embodiment is provided with the positioning protrusion part 72 to be inserted into the first positioning hole 24 of the input/output board-side connector 11 as shown in FIG. 9. This achieves highly accurate positioning of the input/output board-side connector 11 with respect to the suction cap 50 in the width direction and the bridge direction.

Thus, in the above-described holding state, the relative position accuracy of the input/output board-side connector 11 and the CPU board-side connector 12 in the bridge direction and the width direction is achieved at a high level through the suction cap 50, which enables the input/output board-side connector 11 and the CPU board-side connector 12 to be accurately surface-mounted on the connector mounting surface 10A of the bridge board 10.

Note that, in this embodiment, the positioning protrusion part 72 and the first positioning hole 24 both have a true circle shape. Thus, the positioning protrusion part 72 does not have the function of inhibiting the CPU board-side connector 12 from rotating relative to the suction cap 50 around the positioning protrusion part 72 as an axis. In this embodiment, the two side walls 52 mainly have the function of inhibiting the rotation of the CPU board-side connector 12. Alternatively, the positioning protrusion part 72 and the first positioning hole 24 may have a rectangular shape, for example, so that the positioning protrusion part 72 has the function of inhibiting the rotation of the CPU board-side connector 12.

As shown in FIG. 9, the input/output board-side cap part 61 and the CPU board-side cap part 62 are symmetric with respect to the center line C3 that divides the suction cap 50 in half in the bridge direction, except for the position of the positioning protrusion part 72. A line L that connects the positioning protrusion part 72 of the input/output board-side cap part 61 and the positioning protrusion part 72 of the CPU board-side cap part 62 obliquely cross the center line C3 when viewed from above.

Finally, a procedure to attach the bridge board assembly 5 to the main board 2 is described hereinbelow.

First, as shown in FIG. 2, the input/output board 3 and the CPU board 4 are mounted on the parts mounting surface 2A of the main board 2. At this time, the positioning of the input/output board 3 with respect to the main board 2 in the width direction and the bridge direction is done by using a positioning pin 2B that is disposed on the main board 2 in advance. Likewise, the positioning of the CPU board 4 with respect to the main board 2 in the width direction and the bridge direction is done by using a positioning pin 2C that is disposed on the main board 2 in advance.

Next, the positioning pin 2B is inserted into the second positioning hole 25 of the input/output board-side connector 11, and also the positioning pin 2C is inserted into the first positioning hole 24 of the CPU board-side connector 12. The positioning of the bridge board assembly 5 with respect to the main board 2 is thereby done in the width direction and the bridge direction.

Then, the bridge board assembly 5 is fastened by a bolt to the main board 2 by inserting the plurality of bolts 8 shown in FIG. 1 into the three bolt holes 26 of the input/output board-side connector 11 and the three bolt holes 26 of the CPU board-side connector 12, for example. The contact parts 20A of the plurality of contacts 20 of the input/output board-side connector 11 thereby respectively elastically come into contact with the plurality of pads 6 of the input/output board 3 shown in FIG. 2, and also the contact parts 20A of the plurality of contacts 20 of the CPU board-side connector 12 respectively elastically come into contact with the plurality of pads 7 of the CPU board 4. As a result, the plurality of pads 6 of the input/output board 3 are respectively electrically connected to the plurality of pads 7 of the CPU board 4 through the bridge board assembly 5.

A preferred embodiment of the present disclosure is described above. The above-described embodiment has the following features.

As shown in FIG. 8, the connector assembly E includes the input/output board-side connector 11, the CPU board-side connector 12, and the suction cap 50 capable of holding the input/output board-side connector 11 and the CPU board-side connector 12 when surface-mounting the input/output board-side connector 11 and the CPU board-side connector 12, apart from each other, onto the connector mounting surface 10A of the bridge board 10 (board). As shown in FIG. 6, each of the input/output board-side connector 11 and the CPU board-side connector 12 includes the plurality of contacts 20 and the flat-plate housing 21 that holds the plurality of contacts 20. The housing 21 has the first positioning hole 24 (positioning hole) that penetrates the housing 21 in the vertical direction (the thickness direction of the housing 21). As shown in FIG. 9, the suction cap 50 includes the suction plate part 51 that can be sucked by a suction nozzle, and the plurality of positioning protrusion parts 72, each of which is to be inserted into the first positioning hole 24 of the housing 21 of the input/output board-side connector 11 and the CPU board-side connector 12 in the state where the suction cap 50 holds the input/output board-side connector 11 and the CPU board-side connector 12. Each positioning protrusion part 72 is inserted into each corresponding first positioning hole 24 in the state where the suction cap 50 holds the input/output board-side connector 11 and the CPU board-side connector 12, which enables the positioning of the input/output board-side connector 11 and the CPU board-side connector 12 with respect to the suction cap 50. In this structure, the positioning of the input/output board-side connector 11 and the CPU board-side connector 12 with respect to the suction cap 50 and the reduction of the height of the input/output board-side connector 11 and the CPU board-side connector 12 are both achieved.

Further, as shown in FIG. 3, the input/output board-side connector 11 (first connector) and the CPU board-side connector 12 (second connector) have the same shape. This structure contributes to cost reduction compared with the case where the input/output board-side connector 11 and the CPU board-side connector 12 have different shapes.

Further, as shown in FIG. 6, each housing 21 of the input/output board-side connector 11 and the CPU board-side connector 12 is formed in a rectangular flat-plate shape having the four end faces 23. The four end faces 23 include the second bridge end face 23B (first end face). As shown in FIGS. 3 and 8, in the state where the suction cap 50 holds the input/output board-side connector 11 and the CPU board-side connector 12, the second bridge end face 23B of the housing 21 of the input/output board-side connector 11 and the second bridge end face 23B of the housing 21 of the CPU board-side connector 12 are opposed to each other. This structure allows the input/output board-side connector 11 and the CPU board-side connector 12 to be surface-mounted on the connector mounting surface 10A of the bridge board 10 in such a way that the second bridge end face 23B of the housing 21 of the input/output board-side connector 11 and the second bridge end face 23B of the housing 21 of the CPU board-side connector 12 are opposed to each other as shown in FIG. 3.

Further, as shown in FIG. 7, the four end faces 23 include the first width end face 23C (second end face) and the second width end face 23D (third end face) that are adjacent to the second bridge end face 23B. The first positioning hole 24 is closer to the first width end face 23C than to the second width end face 23D. In this structure, in the state where the suction cap 50 holds the input/output board-side connector 11 and the CPU board-side connector 12, a line R that connects the first positioning hole 24 of the housing 21 of the input/output board-side connector 11 and the first positioning hole 24 of the housing 21 of the CPU board-side connector 12 is oblique to the bridge direction.

Further, as shown in FIG. 12, the first positioning hole 24 and the positioning protrusion part 72 are formed in a true circle shape. In this structure, the positioning protrusion part 72 is easily inserted into the first positioning hole 24, which allows the suction cap 50 to easily hold the input/output board-side connector 11 and the CPU board-side connector 12.

Further, as shown in FIG. 13, the input/output board-side connector 11 and the CPU board-side connector 12 include the locking part 35. The suction cap 50 includes the plurality of first locking elastic pieces 70 (locking elastic pieces). In this embodiment, the plurality of first locking elastic pieces 70 include the first locking elastic piece 70 of the input/output board-side cap part 61 and the first locking elastic piece 70 of the CPU board-side cap part 62. The suction cap 50 is configured to hold the input/output board-side connector 11 and the CPU board-side connector 12 by the plurality of first locking elastic pieces 70 catching on the locking part 35 of each of the input/output board-side connector 11 and the CPU board-side connector 12. In the state where the suction cap 50 holds the input/output board-side connector 11 and the CPU board-side connector 12, the first locking elastic piece 70 is movable in the vertical direction with respect to the locking part 35. In this structure, it is possible to align the postures of the input/output board-side connector 11 and the CPU board-side connector 12 in the state where the suction cap 50 holds the input/output board-side connector 11 and the CPU board-side connector 12, which allows the input/output board-side connector 11 and the CPU board-side connector 12 to be surface-mounted on the connector mounting surface 10A of the bridge board 10 without any problem.

Note that the locking part 35 may be formed on the housing 21 rather than on the first hold-down 22A or the second hold-down 22B.

The number of contacts of the input/output board-side connector 11 and the CPU board-side connector 12 is 126 in the above-described embodiment. Alternatively, the number of contacts of the input/output board-side connector 11 and the CPU board-side connector 12 may be 74.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A connector assembly comprising:
 a plurality of connectors; and
 a suction cap extending in a width direction and a bridge direction that is orthogonal to the width direction, and configured to hold the plurality of connectors adjacent to each other in the bridge direction when surface-mounting the plurality of connectors, apart from each other, onto a connector mounting surface of a board, wherein
 each of the connectors includes a plurality of contacts and a flat-plate housing that holds the plurality of contacts,
 the housing of each of the connectors has a positioning hole that penetrates the housing in a thickness direction of the housing,
 the suction cap includes a suction plate part to be sucked by a suction nozzle, and a plurality of positioning protrusion parts extending in a vertical direction that is orthogonal to the width direction and the bridge direction, each to be inserted into the positioning hole of the housing of each of the plurality of connectors in a state where the suction cap holds the plurality of connectors, wherein
 each of the connectors is configured to be positionable with respect to the suction cap by inserting each of the positioning protrusion parts into each corresponding positioning hole in the state where the suction cap holds the plurality of connectors, wherein each of the positioning protrusion parts is insertable in each corresponding positioning hole unobstructed in the vertical direction without being elastically displaced,
 each of the connectors includes a locking part,
 the suction cap includes a plurality of locking elastic pieces each in the form of a cantilever beam supported by the suction plate part to be elastically displaceable between a position of catching on the locking part of the plurality of connectors and a position of detaching from the locking part of the plurality of connectors, the suction cap is configured to hold the plurality of connectors by the plurality of locking elastic pieces respectively catching on the locking part of the plurality of connectors.

2. The connector assembly according to claim 1, wherein the plurality of connectors include a first connector and a second connector having the same shape.

3. The connector assembly according to claim 2, wherein the housing of each of the first connector and the second connector is formed in a rectangular flat-plate shape having four end faces, the four end faces include a first end face, and in the state where the suction cap holds the first connector and the second connector, the first end face of the housing of the first connector and the first end face of the housing of the second connector are opposed to each other, each connector is formed to be asymmetric with respect to a centerline that divides the connector in half in the bridge direction wherein each housing of the first and second connectors has first and second bridge end faces, and in the state where the suction cap holds the first connector and the second connector, the first bridge end face of the housing of the first connector and the first bridge end face of the housing of the second connector are opposed to each other.

4. The connector assembly according to claim 3, wherein the four end faces include a second end face and a third end face adjacent to the first end face, the second and third end faces being parallel to one another, and the positioning hole is closer to the second end face than to the third end face.

5. The connector assembly according to claim 1, wherein the positioning hole and the positioning protrusion part are formed in a true circle shape.

6. The connector assembly according to claim 1, wherein in the state where the suction cap holds the plurality of connectors, each of the locking elastic pieces are movable in the thickness direction of each of the housings with respect to each of the locking parts.

7. A connector assembly comprising:

a plurality of connectors; and a suction cap configured to hold the plurality of connectors when surface-mounting the plurality of connectors, apart from each other, onto a connector mounting surface of a board, wherein each of the connectors includes a plurality of contacts and a flat-plate housing that holds the plurality of contacts, the housing of each of the connectors has a positioning hole that penetrates the housing in a thickness direction of the housing, the suction cap includes a suction plate part to be sucked by a suction nozzle, and a plurality of positioning protrusion parts, each to be inserted into the positioning hole of the housing of each of the plurality of connectors in a state where the suction cap holds the plurality of connectors, wherein each of the connectors is configured to be positionable with respect to the suction cap by inserting each of the positioning protrusion parts into each corresponding positioning hole in the state where the suction cap holds the plurality of connectors, each of the connectors includes a locking part, the suction cap includes a plurality of locking elastic pieces, the suction cap is configured to hold the plurality of connectors by the plurality of locking elastic pieces respectively catching on the locking part of the plurality of connectors, and in the state where the suction cap holds the plurality of connectors, each of the locking elastic pieces are movable in the thickness direction of each of the housings with respect to each of the locking parts.

8. The connector assembly according to claim 7, wherein the plurality of connectors include a first connector and a second connector having the same shape.

9. The connector assembly according to claim 8, wherein the housing of each of the first connector and the second connector is formed in a rectangular flat-plate shape having four end faces, the four end faces include a first end face, and in the state where the suction cap holds the first connector and the second connector, the first end face of the housing of the first connector and the first end face of the housing of the second connector are opposed to each other, each connector is formed to be asymmetric with respect to a centerline that divides the connector in half in the bridge direction wherein each housing of the first and second connectors has first and second bridge end faces, and in the state where the suction cap holds the first connector and the second connector, the first bridge end face of the housing of the first connector and the first bridge end face of the housing of the second connector are opposed to each other.

10. The connector assembly according to claim 9, wherein the four end faces include a second end face and a third end face adjacent to the first end face, the second and third end faces being parallel to one another, and the positioning hole is closer to the second end face than to the third end face.

11. The connector assembly according to claim 7, wherein the positioning hole and the positioning protrusion part are formed in a true circle shape.

* * * * *